US007524697B2

(12) United States Patent
Makihira et al.

(10) Patent No.: US 7,524,697 B2
(45) Date of Patent: Apr. 28, 2009

(54) METHOD FOR MANUFACTUING A SEMICONDUCTOR INTEGRATED CIRCUIT DEVICE

(75) Inventors: Naohiro Makihira, Tokyo (JP); Satoshi Imasu, Tokyo (JP); Masanao Sato, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/594,116

(22) PCT Filed: Jan. 18, 2005

(86) PCT No.: PCT/JP2005/000509

§ 371 (c)(1),
(2), (4) Date: Aug. 7, 2007

(87) PCT Pub. No.: WO2005/093442

PCT Pub. Date: Oct. 6, 2005

(65) Prior Publication Data

US 2007/0287206 A1    Dec. 13, 2007

(30) Foreign Application Priority Data

Mar. 26, 2004    (JP)    ............................. 2004-092982

(51) Int. Cl.
*H01L 21/00*    (2006.01)
(52) U.S. Cl. ...................... 438/106; 438/108; 438/117; 438/631; 438/632; 257/E21.514; 257/E21.006; 257/E23.019; 257/E23.021; 257/E21.119

(58) Field of Classification Search ............. 438/14–18, 438/612–614, 106–117; 324/158.1, 754–765; 257/48, E21.514, E23.006, E23.019, E23.021, 257/E23.119
See application file for complete search history.

(56) References Cited

U.S. PATENT DOCUMENTS

| 6,181,569 B1 * | 1/2001 | Chakravorty ................ 361/761 |
| 6,337,522 B1 * | 1/2002 | Kang et al. .................. 257/784 |
| 6,518,781 B2 * | 2/2003 | Masuda ....................... 324/757 |
| 6,573,739 B1 * | 6/2003 | Saito ........................... 324/755 |
| 6,621,154 B1 * | 9/2003 | Satoh et al. ................. 257/684 |
| 6,841,413 B2 * | 1/2005 | Liu et al. ..................... 438/106 |
| 2001/0026021 A1 * | 10/2001 | Honda ......................... 257/778 |

FOREIGN PATENT DOCUMENTS

JP    2000-235062    8/2000

* cited by examiner

*Primary Examiner*—Michael S Lebentritt
(74) *Attorney, Agent, or Firm*—Antonelli, Terry, Stout & Kraus, LLP.

(57) ABSTRACT

A burn-in process for a semiconductor integrated circuit device includes a first process of positioning bump electrodes of the semiconductor integrated circuit device with respect to pads of a socket having detachment mechanisms, a second process of pressing the bump electrodes against the pads by weighting the semiconductor integrated circuit device, and a third process of detaching the bump electrodes from the pads by exerting force on the semiconductor integrated circuit device in a direction opposite to a weighting direction of the second process. Automatic insertion and detachment of a semiconductor integrated circuit chip in a burn-in test is facilitated by detaching the bump electrodes from the pads by pushing up the semiconductor integrated circuit device.

26 Claims, 8 Drawing Sheets

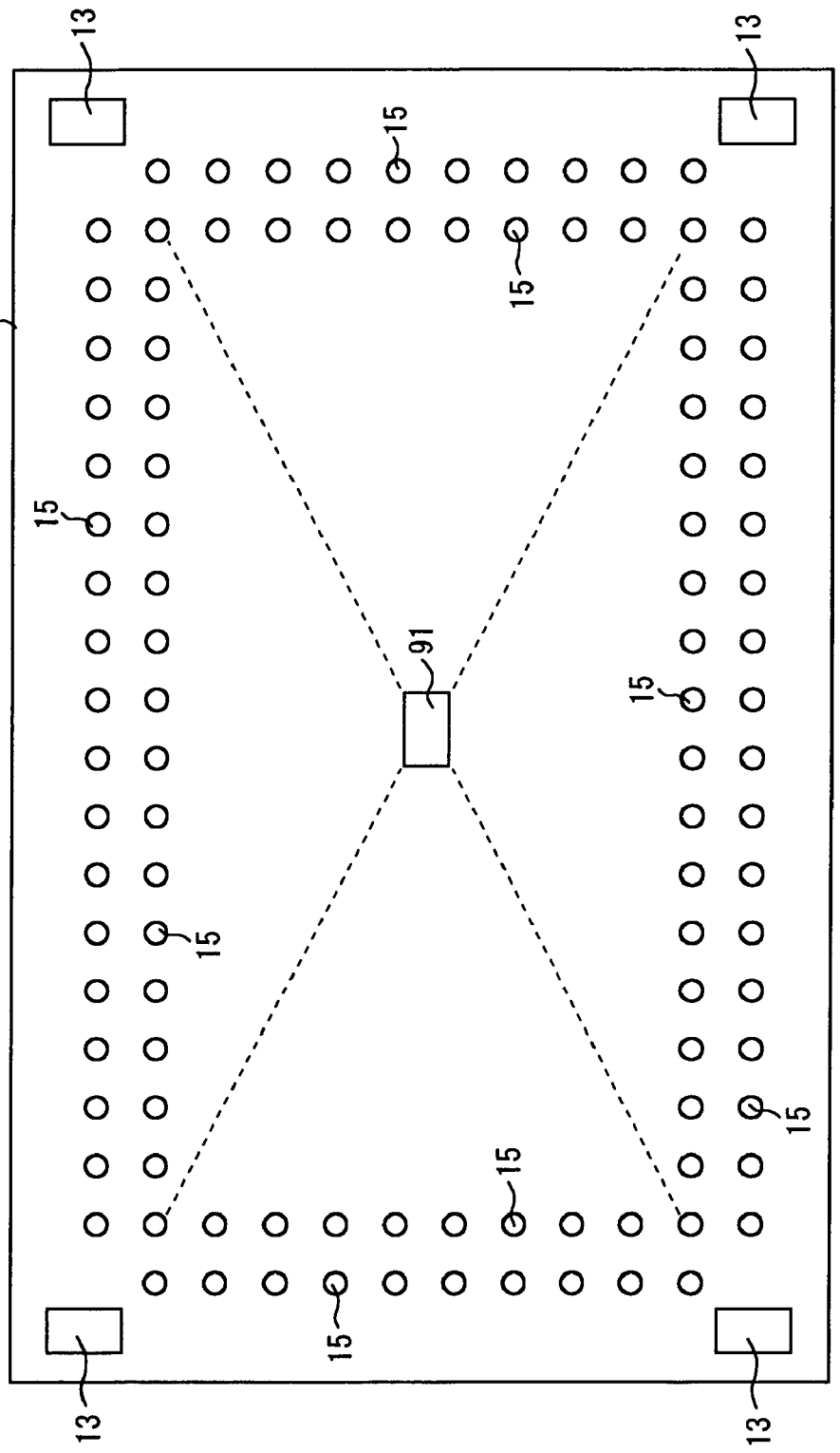

METHOD FOR MANUFACTUING A SEMICONDUCTOR INTEGRATED CIRCUIT DEVICE

FIELD OF THE INVENTION

The present invention relates to a technique for manufacturing a semiconductor device. For example, the invention relates to a technique which is effectively applied to attachment/detachment of a semiconductor device having bump electrodes as external connection terminals to/from a burn-in (accelerated energization) test apparatus.

BACKGROUND OF THE INVENTION

JP-A-2000-235062 (FIG. 1 etc.) discloses an improvement of electrodes of a burn-in test socket (also referred to simply as "socket") which are brought in contact with bump electrodes of a semiconductor integrated circuit device (semiconductor device) in a burn-in test of the semiconductor integrated circuit device.

SUMMARY OF THE INVENTION

In manufacturing processes of semiconductor integrated circuits, to remove defective products and measure product lifes, chips that have been obtained by dicing a wafer and sealed in packages are subjected to a burn-in test before shipment. The burn-in test is a test in which the external connection terminals of a package are connected to electrodes (pads) of a board (socket board) attached to a socket and a semiconductor integrated circuit chip in the package is caused to operate continuously for about several hours in a high-temperature atmosphere (100° C. or higher) while currents and voltages are supplied to it from an external power source.

To secure good electrical continuity with the external connection terminals of the package, the socket board (tape board) which is used for the burn-in test is designed and manufactured for each type of package in accordance with the shape and the number of pins of the external connection terminals.

In recent years, the mainstream semiconductor packages are shifting from old types such as the QFP (quad flat package) and the SOJ (small outline J-leaded package) in which leads as external connection terminals lead from the side faces of a package to surface-mount types such as the BGA (ball grind array) and the CSP (chip size package) in which bump electrodes that are attached to the device formation surface of a chip or the mounting surface of a package serve as external connection terminals.

Where a BGA chip or a CSP package in which ball-shaped bump electrodes are used as external connection terminals is subjected to a burn-in test, point contact is established between the electrodes (pads) of the socket board and the bump electrodes. Therefore, the contact resistance between the two kinds of electrodes may become unduly large or electrical continuity between part of the bump electrodes and corresponding pads may be lost due to a variation in the diameter of the bump electrodes. One measure for securing good contact between the pads and the bump electrodes is to crush the bump electrodes of the package (or chip) by pressing the package (or chip) after the bump electrodes are positioned with respect to the pads of the socket board.

However, if the areas of contact to the pads are increased by crushing the bump electrodes excessively, there may occur trouble that after a test the bump electrodes become hard to detach from the pads and (part of) the bump electrodes are separated from the package (or chip) and left in contact with the corresponding pads when the package (or chip) is removed from the socket.

To secure good electrical continuity with the pads of the socket board without the need for crushing the bump electrodes of the package excessively, it is desirable to form plural minute projections on each pad of the socket board.

However, if a high-temperature burn-in test is performed by connecting the bump electrodes to the pads that are formed with such minute projections, a thin, natural oxide film formed on the surface of each bump electrode is left on the surfaces of the projections when the bump electrodes are detached from the pads after the test. As a result, as burn-in tests are repeated, the thickness of the natural oxide film that is left on the surfaces of the projections increases gradually to cause increase or variation of the contact resistance between the bump electrodes and the projections. This makes it difficult to perform a stable test.

Since a burn-in test is performed for several hours in a high-temperature atmosphere (100° C. or higher), the bump electrodes soften to some extent due to heat that is generated during the test. In particular, bump electrodes made of a low-melting-point metal such as Sn/Pb solder are more prone to soften. Therefore, if the bottom of a bump electrode is in contact with a pad surface between projections, part of the bump electrode may left stuck to the surface of the corresponding pad when the bump electrode is detached from the surface of the pad after a test. As burn-in tests are repeated a certain number of times, the thickness of the bump electrode material that is stuck to the surface of the pad increases gradually. The level difference between the surfaces of the projections and the surface of the pad may disappear, in which case the advantage of the formation of the projections is lost.

In view of the above, the present assignee previously developed a technique for keeping stable the contact resistance between the pads (electrodes) of a socket board and the bump electrodes in a burn-in test of a semiconductor integrated circuit chip whose external connection terminals are bump electrodes (JP-A-2000-235062). In this technique, plural pads are formed on the major surface of the socket board so as to be integral with interconnections and plural projections are formed on the surface of each pad in such a manner that their height and distance are determined so that a bump electrode to be connected to each pad does not come into contact with the surface of the pad in a burn-in test. This makes it possible to keep stable the contact resistance between the bump electrodes of a package or a semiconductor integrated circuit chip and the pads of a socket board.

A study of the present inventors has discovered the following. The edges of the contact projections cut into the bump electrodes and the surface coatings of the bump electrodes are thereby broken, whereby good contact performance can be obtained. However, since the edges of the contact projections cut into the bump electrodes and the Au of the topmost plating layer of the contact projections has a chemical affinity for the solder of the bump electrodes, the contact projections tend to be joined to the bump electrodes. Therefore, when it is attempted after a burn-in test to detach a semiconductor integrated circuit chip having a large number of pins from a socket by attracting it with a vacuum pad of an automatic inserter remover, it may be difficult to detach the semiconductor integrated circuit chip from the socket because of insufficient suction force of the vacuum pad. As the number of pins of the semiconductor integrated circuit device increases, this tendency becomes more remarkable and the automatic insertion and removal of the semiconductor integrated circuit chip in a burn-in test becomes more difficult.

An object of one aspect of the invention disclosed in this application is to provide a technique which makes it possible to manufacture a highly reliable semiconductor integrated circuit device.

An object of another aspect of the invention disclosed in this application is to provide a burn-in test technique which is suitable for semiconductor integrated circuit devices having high-density bump electrodes.

An object of another aspect of the invention disclosed in this application is to provide a burn-in test technique which is suitable for semiconductor integrated circuit devices having bump electrodes whose height is low relative to their width.

These and other objects and novel features of the invention will become apparent from the following description of this specification taken in connection with the accompanying drawings.

<<1>> Brief outlines of typical aspects of the invention disclosed in this application are as follows:

A manufacturing method of a semiconductor integrated circuit device disclosed in this application comprises the steps of:

(a) forming circuits in a semiconductor substrate;

(b) dividing the semiconductor substrate on which the circuits are formed into chip-shaped semiconductor integrated circuit devices;

(c) performing a burn-in test on the divisional semiconductor integrated circuit devices; and (d) selecting non-defective devices from the semiconductor integrated circuit devices that have been subjected to the burn-in test.

Each semiconductor integrated circuit device has bump electrodes as external connection electrodes. And the step (c) comprises a first substep of attaching a semiconductor integrated circuit device to a burn-in test socket, a second substep of causing the semiconductor integrated circuit device to operate together with the burn-in test socket in a state that the bump electrodes of the semiconductor integrated circuit device is pressed against pad electrodes of the burn-in test socket by pressing the attached semiconductor integrated circuit device, and a third substep of canceling the pressing pressure acting on the semiconductor integrated circuit device and pushing up the semiconductor integrated circuit device in such a direction as to detach the bump electrodes from the pad electrodes after the end of operation of the semiconductor integrated circuit device. The third substep makes it possible to separate the semiconductor integrated circuit in such a manner that it is detached from the pad electrodes of the burn-in test socket.

In the above method, a burn in test is performed on the semiconductor integrated circuit device in a state that the bump electrodes of the semiconductor integrated circuit device are pressed against the pad electrodes of the burn-in test socket. After the test, the pressing pressure acting on the semiconductor integrated circuit device is canceled and the semiconductor integrated circuit device is pushed up in such a direction that the bump electrodes are detached from the pad electrodes. Therefore, even if the bump electrodes come to cut into the pad electrodes more strongly because of tendencies of pitch reduction and increase in the number of terminals of the bump electrodes of semiconductor integrated circuit devices, force that is stronger than the cutting-in force can be exerted on the semiconductor integrated circuit device by setting the pushing-up force properly. Where a semiconductor integrated circuit device is detached by vacuum suction, to increase the detaching force it is necessary to increase the vacuum suction force. However, it may be difficult to change the vacuum suction force used in the entire manufacturing line of semiconductor integrated circuit devices only to satisfy the above requirement. Also in this respect, the above-described method can contribute to the facilitation of the process of detaching the semiconductor integrated circuit device from the burn-in test socket.

In one aspect of the invention disclosed in this application, the bump electrodes are solder ball electrodes, for example. Solder ball electrodes tend to be deformed by heat that is generated during a burn-in test, and hence relatively strong force is necessary in the process of detaching those.

In another aspect of the invention disclosed in this application, each pad electrode is such that plural divisional projections are provided on a planar pad. In the second substep, the plural projections support a bump electrode that is being pressed against the pad electrode in such a manner that the bump electrode does not come into contact with the planar pad. This makes it possible to keep stable the electrical contact between the pad electrodes and the bump electrodes in a burn-in test.

In another aspect of the invention disclosed in this application, in the third substep, the semiconductor integrated circuit device is pushed up by recovery force of elastic members. In the second substep, the bump electrodes are pressed against the pad electrodes by deforming the elastic members. The elastic members may be springs.

In still another aspect of the invention disclosed in this application, a manufacturing method of a semiconductor integrated circuit device using a wafer-level CSP technique, the step (a) comprises a substep of forming a chip base in which plural circuit elements are formed in a semiconductor substrate and bonding pads are exposed on the surface, a substep of forming, on the chip base, re-interconnections which are connected to the bonding pads and metal layers which are not connected to the bonding pads and covering the surface with a heat-resistant thermosetting resin film except for portions of the re-interconnections and portions of the metal layers, and a substep of forming bump electrodes on those portions of the re-interconnections which are exposed through the heat-resistant thermosetting resin film.

In this case, it is preferable that in the third substep the semiconductor integrated circuit device be pushed up by exerting the pushing-up force on those portions of the metal layers which are exposed through the heat-resistant thermosetting resin film. This is to prevent the heat-resistant thermosetting resin film from being damaged.

This method is suitable for the manufacture of semiconductor integrated circuit devices in which the arrangement pitch of the plural bump electrodes is as small as less than 0.5 mm.

In yet another aspect of the invention disclosed in this application, a semiconductor integrated circuit device manufactured by using a wafer-level CSP technique comprises a chip base in which plural circuit elements are formed in a semiconductor substrate and bonding pads are exposed on the surface, re-interconnections which are formed on the chip base and connected to the bonding pads, metal layers which are formed on the chip base and are not connected to the bonding pads, a heat-resistant thermosetting resin film which covers the surface except for portions of the re-interconnections and portions of the metal layers, and bump electrodes which are formed on those portions of the re-interconnections which are exposed through the heat-resistant thermosetting resin film. Plural metal layers are formed on peripheral portions of the chip base. It is preferable that after the end of a burn-in test the semiconductor integrated circuit device be detached from the pad electrodes of the burn-in test socket by exerting the pushing-up force on those portions of the metal layers which are exposed through the heat-resistant thermosetting resin film. To this end, it is preferable to provide at least three metal layers, in which case the pushing-up force can be exerted in a stable manner and the detached semiconductor integrated circuit device hardly assumes an unstable posture.

A manufacturing method of an electronic circuit device disclosed in this application comprises the steps of:

(a) mounting circuit devices on package boards;

(b) testing electronic circuits which is mounted with the circuit devices; and (c) selecting non-defective electronic circuits from the tested electronic circuits.

The step (c) comprises a first substep of attaching, to a mounting socket, an electronic circuit in which circuit devices are mounted on a package board, a second substep of causing the electronic circuit to operate together with the mounting socket while pressing external connection electrodes of the package board against pad electrodes of the mounting socket by pressing the attached electronic circuit, and a third substep of canceling the pressing pressure acting on the electronic circuit and pushing up the electronic circuit in such a direction as to detach the external connection electrodes from the pad electrodes after the end of operation of the electronic circuit. This method makes it possible to detach the electronic circuit easily and reliably.

<<2>> Outlines of other aspects of the invention disclosed in this application will be described below briefly in an itemized manner.

[1] A manufacturing method of a semiconductor integrated circuit device comprises the steps of:

(a) forming circuits in a semiconductor substrate (first step);

(b) dividing the semiconductor substrate on which the circuits are formed into chip-shaped semiconductor integrated circuit devices (second step);

(c) performing a burn-in test on the divisional semiconductor integrated circuit devices (third step); and (d) selecting non-defective devices from the semiconductor integrated circuit devices that have been subjected to the burn-in test (fourth step).

Each semiconductor integrated circuit device has bump electrodes as external connection electrodes. And the step (c) comprises the substeps of:

(i) attaching a semiconductor integrated circuit device to a burn-in test socket (first substep);

(ii) causing the semiconductor integrated circuit device to operate together with the burn-in test socket while pressing the bump electrodes of the semiconductor integrated circuit device against pad electrodes of the burn-in test socket by pressing the attached semiconductor integrated circuit device (second substep); and (iii) canceling the pressing pressure acting on the semiconductor integrated circuit device and pushing up the semiconductor integrated circuit device in such a direction as to detach the bump electrodes from the pad electrodes after the end of operation of the semiconductor integrated circuit device (third substep).

[2] The manufacturing method of a semiconductor integrate circuit device recited in item 1, wherein the bump electrodes are solder ball electrodes.

[3] The manufacturing method of a semiconductor integrate circuit device recited in item 1 or 2, wherein each pad electrode is such that plural divisional projections are provided on a planar pad, and in the second substep the plural projections support a bump electrode that is being pressed against the pad electrode in such a manner that the bump electrode does not come into contact with the planar pad.

[4] The manufacturing method of a semiconductor integrate circuit device recited in any one of items 1 to 3, wherein in the third substep the semiconductor integrated circuit device is pushed up by recovery force of elastic members, and in the second substep the bump electrodes are pressed against the pad electrodes by deforming the elastic members.

[5] The manufacturing method of a semiconductor integrate circuit device recited in item 4, wherein the elastic members are springs.

[6] The manufacturing method of a semiconductor integrate circuit device recited in any one of items 1 to 5, wherein the first step comprises the substeps of:

(x) forming a chip base in which plural circuit elements are formed in a semiconductor substrate and bonding pads are exposed on the surface;

(y) forming, on the chip base, re-interconnections which are connected to the bonding pads and metal layers which are not connected to the bonding pads, and covering the surface with a heat-resistant thermosetting resin film except for portions of the re-interconnections and portions of the metal layers; and (z) forming bump electrodes on those portions of the re-interconnections which are exposed through the heat-resistant thermosetting resin film.

[7] The manufacturing method of a semiconductor integrate circuit device recited in item 6, wherein in the third step the semiconductor integrated circuit device is pushed up by exerting the pushing-up force on those portions of the metal layers which are exposed through the heat-resistant thermosetting resin film.

[8] The manufacturing method of a semiconductor integrate circuit device recited in any one of items 1 to 7, wherein the arrangement pitch of the plural bump electrodes is smaller than 0.5 mm.

[9] A semiconductor integrated circuit device comprising:

(a) a chip base in which plural circuit elements are formed in a semiconductor substrate and bonding pads are exposed on the surface;

(b) re-interconnections which are formed on the chip base and connected to the bonding pads;

(c) metal layers which are formed on the chip base and are not connected to the bonding pads;

(d) a heat-resistant thermosetting resin film which covers the surface except for portions of the re-interconnections and portions of the metal layers; and (e) bump electrodes which are formed on those portions of the re-interconnections which are exposed through the heat-resistant thermosetting resin film.

In this semiconductor integrated circuit device, plural metal layers are formed on peripheral portions of the chip base.

[10] The semiconductor integrated circuit device recited in item [9], wherein at least three metal layers are provided.

[11] A manufacturing method of an electronic circuit device, comprising the steps of:

(a) mounting circuit devices on package boards (first step);

(b) testing electronic circuit devices which are mounted with the circuit devices (second step); and (c) selecting non-defective electronic circuit devices from the tested electronic circuit devices (third step).

The step (c) (third step) comprises the substeps of:

(i) attaching, to a mounting socket, an electronic circuit device in which circuit devices are mounted on a package board (first substep);

(ii) causing the electronic circuit device to operate together with the mounting socket while pressing external connection electrodes of the package board against pad electrodes of the mounting socket by pressing the attached electronic circuit device (second substep); and (iii) canceling the pressing pressure acting on the electronic circuit device and pushing up the electronic circuit device in such a direction as to detach the external connection electrodes from the pad electrodes after the end of operation of the electronic circuit device (third substep).

<<3>> Outlines of yet other aspects of the invention disclosed in this application will be described below briefly in an itemized manner.

[1] A manufacturing method of a semiconductor integrated circuit device comprises the steps of:

(a) forming ordinary interconnections (e.g., aluminum multi-layer interconnections or copper damascene or dual damascene multi-layer interconnections) on a first major surface of a wafer;

(b) forming re-interconnections (e.g., copper-based rearrangement interconnections or re-distribution interconnections) including plural first metal film regions and plural second metal film regions over the ordinary interconnections (this step is not indispensable; that is, the invention can also be applied to a case that no re-interconnections are provided as long as bump electrodes are provided);

(c) forming a polymeric resin film over the re-interconnections (by general lithography, application of a sealing resin or some other resin, printing, molding, or the like);

(d) forming plural first metal pad regions (circular openings in a secondary final passivation over bump underlying metal layers) and plural second metal pad regions (mainly rectangular or square (or otherwise shaped) openings in the same secondary final passivation over underlying metal layers; the dimensions are 250 μm (vertical)×500 μm (horizontal)) by forming openings through portions of the polymeric resin film which correspond to the first metal film regions and the second metal film regions, respectively, by a lithography technique (the second metal film regions are not indispensable; since the basic requirement is that the top surface of the polymeric resin film not be damaged, satisfactory results are obtained by applying pressure in a step of detaching bumps from an electrode surface (described below) without touching the top surface of the polymeric resin film or without damaging it even if touching it; therefore, one method is to directly push the top surface of the polymeric resin film with a pushing member having a relatively wide contact surface that is softer than the polymeric resin film; the term "top surface" does not mean a top surface as defined according to gravity but means a device formation surface (i.e., bump formation surface) of a chip, a surface located on the side of the first major surface of the wafer, or the like);

(e) forming solder bumps on the respective first metal pad regions;

(f) after the step (e), dividing the wafer into plural semiconductor integrated circuit chips;

(g) causing a bump formation surface, corresponding to the first major surface of the wafer, of a first semiconductor integrated circuit chip among the plural divisional semiconductor integrated circuit chips to be opposed to an electrode surface of a burn-in test socket, and performing a burn-in test in a state that the plural bumps on the bump formation surface and plural metal projection electrodes on the electrode surface are pressed against each other; and (h) after the step (g), separating the metal projection electrodes and the solder bumps of the first semiconductor integrated circuit chip from each other by pushing at least one of the plural second metal pad regions on the bump formation surface in such a direction that the first semiconductor integrated circuit chip and the electrode surface go away from each other by bringing at least one pushing member whose contact surface (e.g., a rectangular surface measuring 150 μm (vertical)×400 μm (horizontal)) is narrower than the at least one second metal pad region into contact with the at least one second metal pad region.

[2] The manufacturing method of a semiconductor integrated circuit device recited in item 1, wherein the polymeric resin film contains a thermosetting resin as a main component.

[3] The manufacturing method of a semiconductor integrated circuit device recited in item 1 or 2, wherein the polymeric resin film contains a heat-resistant thermosetting resin (polyimide resin, BCB (benzocyclobutene), or the like) as a main component.

[4] The manufacturing method of a semiconductor integrated circuit device recited in any one of items 1 to 3, wherein the polymeric resin film contains a polyimide resin as a main component.

[5] The manufacturing method of a semiconductor integrated circuit device recited in any one of items 1 to 4, wherein the polymeric resin film contains an organic thermosetting resin as a main component.

[6] The manufacturing method of a semiconductor integrated circuit device recited in any one of items 1 to 5, wherein a pitch of the solder bumps is smaller than 500 μm (the solder is lead-free solder, for example).

[7] The manufacturing method of a semiconductor integrated circuit device recited in any one of items 1 to 6, wherein the solder bumps are formed by a lithography technique or a printing technique.

[8] The manufacturing method of a semiconductor integrated circuit device recited in any one of items 1 to 7, wherein a ratio (H/D) of a height (H) to a diameter (D) of the solder bumps in terms of an average ratio of completed bumps in the chip is smaller than 60% (e.g., the bump diameter is 180 μm and the bump height is 100 μm; the diameter of each second metal pad region is set so as to produce a solder bump having such a shape because of solder surface tension at the time of a reflow of solder).

[9] The manufacturing method of a semiconductor integrated circuit device recited in any one of items 1 to 8, wherein the number of at least one second metal pad region in the first semiconductor integrated circuit chip is two or more.

[10] The manufacturing method of a semiconductor integrated circuit device recited in any one of items 1 to 8, wherein the number of at least one second metal pad region in the first semiconductor integrated circuit chip is three or more (this feature provides an advantage that inclination of the chip is prevented, whereby the plural second metal pad regions are pushed uniformly; furthermore, relatively uniform forces are applied to the plural solder bumps).

[11] The manufacturing method of a semiconductor integrated circuit device recited in any one of items 1 to 10, wherein the at least one second metal pad region in the first semiconductor integrated circuit chip is provided in a chip peripheral portion of the bump formation surface of the first semiconductor integrated circuit chip (if the at least one second metal pad region is provided in the chip peripheral portion, the probability that the pushing members or the like touch the bumps is low).

[12] The manufacturing method of a semiconductor integrated circuit device recited in any one of items 1 to 11, wherein the at least one second metal pad region in the first semiconductor integrated circuit chip is provided in a chip corner portion of the bump formation surface of the first semiconductor integrated circuit chip.

[13] The manufacturing method of a semiconductor integrated circuit device recited in any one of items 1 to 12, wherein the at least one second metal pad region in the first semiconductor integrated circuit chip is in an electrically floating state.

[14] The manufacturing method of a semiconductor integrated circuit device recited in any one of items 1 to 13, wherein an area of each of the second metal pad regions is larger than that of each of the first metal pad regions.

[15] The manufacturing method of a semiconductor integrated circuit device recited in any one of items 1 to 14, wherein an area of each of the second metal pad regions is two times or more larger than that of each of the first metal pad regions.

[16] The manufacturing method of a semiconductor integrated circuit device recited in any one of items 1 to 14, wherein an area of each of the second metal pad regions is three times or more larger than that of each of the first metal pad regions.

[17] The manufacturing method of a semiconductor integrated circuit device recited in any one of items 1 to 16, wherein an area of the contact surface of each of the at least one pushing member is two times or more larger than that of each of the first metal pad regions.

[18] The manufacturing method of a semiconductor integrated circuit device recited in any one of items 1 to 17, wherein the at least one pushing member is not brought into contact with a top surface of the polymeric resin film.

[19] The manufacturing method of a semiconductor integrated circuit device recited in any one of items 1 to 18, wherein each of the metal projection electrodes is formed by forming a plating layer having gold as a main component on a core member having nickel as a main component (nickel gives high rigidity to the projection electrodes and gold has an effect of making the contact resistance low).

[20] The manufacturing method of a semiconductor integrated circuit device recited in item 19, wherein each of the metal projection electrodes is formed by further plating, with rhodium, the plating layer having gold as the main component (although the rhodium plating is not indispensable, it has an effect of weakening the physical or chemical affinity between the projection electrodes and the solder bumps).

[21] The manufacturing method of a semiconductor integrated circuit device recited in any one of items 1 to 20, wherein a main portion of the at least one pushing member is made of a metal (this provides a merit that sufficiently high mechanical strength can be secured).

[22] The manufacturing method of a semiconductor integrated circuit device recited in any one of items 1 to 20, wherein a main portion of the at least one pushing member is made of a polymeric resin (i.e., insulator).

[23] The manufacturing method of a semiconductor integrated circuit device recited in item 22, wherein the polymeric resin contains a polyether sulfon resin as a main component (in particular, forming the tip portion of each pushing member with an insulator provides a merit that no particular problem occurs even if the second metal pad regions are not in a floating state).

An advantage obtained by the typical aspects of the invention disclosed in this application will be described briefly. That is, it becomes possible to perform a burn-in test on a semiconductor integrated circuit device having high-density bump electrodes and to thereby provide highly reliable semiconductor integrated circuit devices.

BRIEF DESCRIPTION OF THE DRAWINGS

FIG. 9 illustrates contact targets of a semiconductor integrated circuit chip;

DESCRIPTION OF SYMBOLS

Figure 1:
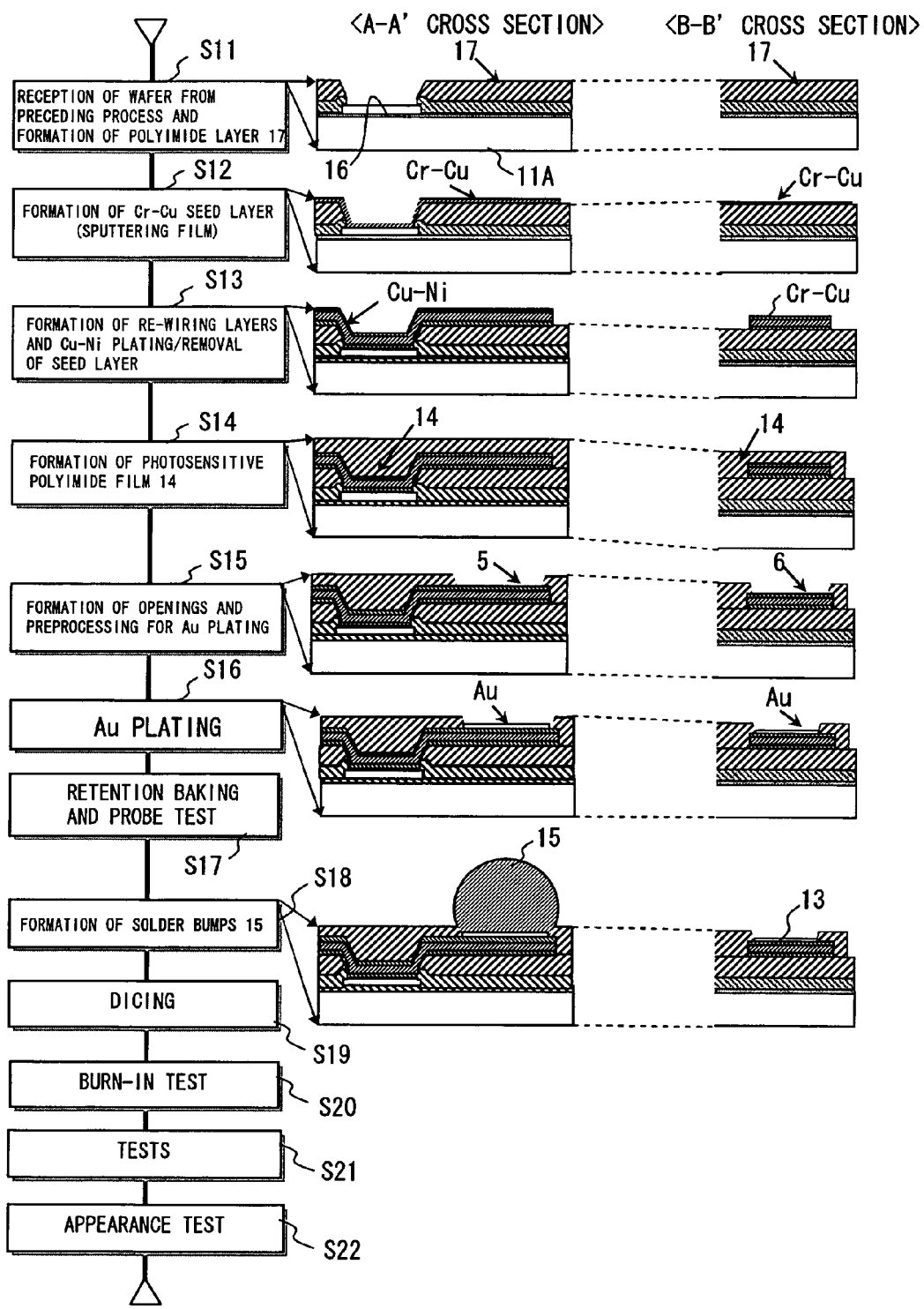
FIG. 1 shows main processes of a manufacturing method of a semiconductor integrated circuit device according to an embodiment of the present invention.

10: Wafer
12: Re-wiring layer
13: Contact target
15: Solder bump
16: Bonding pad
20: Socket
22: Cover
24: Alignment plate
40: Pad
41: Slit
61: Detachment mechanism
62: Alignment plate pre-pushing mechanism
63: Projection
90: Semiconductor integrated circuit chip
222, 622: Spring
341: Projection
621: Pre-pushed portion

DETAILED DESCRIPTION OF THE PREFERRED EMBODIMENTS

An embodiment of the present invention will be hereinafter described in detail with reference to the drawings. In all drawings for the description of the embodiment, the same members are basically given the same reference symbol and will not be described repeatedly.

Before the detailed description of the invention, terms used in this application will be described. The term "semiconductor wafer" covers a silicon single crystal substrate (in general, approximately flat and circular) used for manufacture of integrated circuits, a sapphire substrate, a glass substrate, other insulative, semi-insulative, or semiconductor substrates, and composite substrates thereof. The term "semiconductor integrated circuit device" as used in this application not only covers ones formed on a semiconductor or insulator substrate such as a silicon wafer or a sapphire substrate but also covers, unless otherwise specified, ones formed on other kinds of insulator substrates such as a glass substrate (e.g., a TFT (thin-film transistor) and an STN (super-twisted nematic) liquid crystal).

When necessary for the convenience of description, the following embodiment will be described in such a manner as to be divided into plural sections or embodiments. However, such sections or divisional embodiments are not independent of each other and one section or divisional embodiment is a modification, a detailed description, a supplemental description, or the like of part or the whole of another unless otherwise specified.

In the following embodiment, when reference is made to the number of components or the numerical value, the amount, the range, or the like of a component, it is not limited to a specified number or the like and may be larger than or smaller than the specified number unless otherwise specified or it should clearly be limited to the specified number in principle or for some other reason.

In the following embodiment, it goes without saying that components (including constituent steps) are not necessarily indispensable unless otherwise specified or they are clearly indispensable in principle or for some other reason.

Likewise, in the following embodiment, when reference is made to the shape of a component or the like, the positional relationship between components, or a like item, it includes ones that are substantially approximate or similar to a specified shape or the like unless otherwise specified or the similarity in shape or the like is clearly denied in principle or for some other reason. This also applies to a numerical value and a range as mentioned above.

Figure 10:
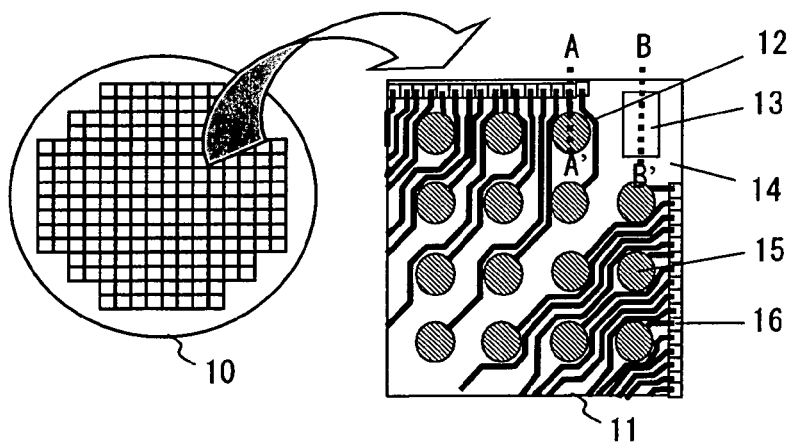
FIG. 10 illustrates a wafer-level CSP as an exemplary semiconductor integrated circuit device.
Figure 11:
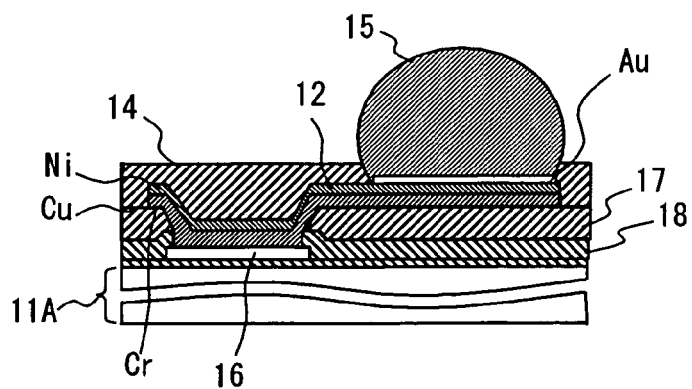
FIG. 11 is a sectional view of an important part of FIG. 10.

FIG. 10 shows a wafer on which wafer-level CSPs which are exemplary semiconductor integrated circuit devices according to the invention are formed (the term "wafer-level CSP" is also the name of the related technique). In FIG. 10, reference numeral 10 denotes a wafer. Many semiconductor integrated circuit chips (semiconductor integrated circuit devices) are obtained from the wafer 10 by executing a dicing process. Reference symbol 11 denotes an enlarged version of an important part of the wafer 10. FIG. 11 is a sectional view taken along line A-A' in FIG. 10. In FIG. 11, reference symbol 11A denotes a chip base in which plural necessary circuit elements such as MOS transistors and wiring layers connecting those are formed in a semiconductor substrate such as a single crystal silicon substrate and bonding pads 16 are exposed on the surface. Re-wiring layers 12 which are made of Cr (chromium), Cu (copper), Ni (nickel), or the like and whose one ends are connected to the bonding pads 16 are formed on the chip base 11A. The wiring layers of the chip base 11A are not limited to interconnections of any kind and may be aluminum multi-layer interconnections, copper damascene or dual damascene multi-layer interconnections, or the like. These wiring layers are ordinary interconnections and are discriminated from the re-wiring layers 12.

The other end of each of the re-wiring layers 12 is plated with Au (gold) and a solder bump (solder ball electrode, bump electrode) 15 is formed on the Au plating layer. The re-wiring layers 12 allow the bump electrodes 15 to be arranged at a pitch that is larger than the arrangement pitch of the bonding pads 16. Plural bump electrodes 15 are arranged at a prescribed arrangement pitch in each chip area. Each semiconductor integrated circuit chip can exchange various signals with the outside via the solder bumps 15. The arrangement pitch of the plural solder bumps 15 is set smaller than 0.5 mm.

To perform a burn-in test on a semiconductor integrated circuit chip having such ultra-fine pitch solder bumps, the semiconductor integrated circuit chip is attached to a socket of a burn-in test apparatus.

Contact targets 13 are formed as metal layers which are not connected the bonding pads 16. As shown in FIG. 9, the contact targets 13 are formed at the four corners of each semiconductor integrated circuit chip 90. As described later in detail, the contact targets 13 are brought into contact with arms of socket detachment mechanisms which are used in a burn-in test. For example, as shown in FIG. 9, 256 bump electrodes 15 are arranged at a pitch of 0.37 mm. Incidentally, this semiconductor integrated circuit chip 90 measures 6.005 mm (vertical)×8.725 mm (horizontal).

As shown in FIG. 9, an opening 91 is formed at the center of the chip 90 in the same manner as the contact targets 13 are formed. The opening 91 is a mark for formation of the solder bumps 15; that is, the plural solder bumps 15 are formed at a prescribed pitch by using the opening 91 as a reference.

A protective film 14 made of polyimide which is an exemplary heat-resistant thermosetting resin film (polymeric resin film) is formed on the surface of the wafer 10 except for the regions of formation of the solder bumps 15 and the contact targets 13. Reference numeral 17 denotes a polyimide insulating layer and numeral 18 denotes a passivation layer. Since the protective film 14 has a function of protecting the underlying re-wiring layers 12 and the circuit elements of the chip base 11A, best efforts should be made to avoid damaging the protective film 14 in a burn-in test etc.

FIG. 1 shows main processes of a manufacturing method of the above semiconductor integrated circuit device. In FIG. 1, sectional views taken along lines A-A' and B-B' in FIG. 10 are shown so as to be correlated with the main processes of the manufacturing method of the above semiconductor integrated circuit device.

It is assumed that bonding pads 16 were formed on a semiconductor substrate in the preceding process. At step S11, a polyimide insulating layer 17 is formed in the regions other than the regions of formation of the bonding pads 16. At step S12, a Cr—Cu seed layer (sputtering film) is formed on the polyimide insulating layer 17. At step S13, re-wiring layers are formed on the Cr—Cu seed layer and then Cu—Ni plating is performed. In the regions where contact targets 13 are to be formed, those portions of the seed layer which will not be necessary for formation of contact targets 13 are removed. At step S14, a polyimide protective film 14 is formed so as to cover the Cu—Ni plating portions. At step S15, openings 5 are formed in the regions where solder bumps 15 are to be formed and openings 6 are formed in the regions where contact targets 13 are to be formed by a lithography technique and pre-processing for Au plating is performed on the openings 5 and 6. At step S16, Au plating is performed on the openings 5 and 6. First metal pad regions are formed by performing Au plating on the openings 5, and second metal pad regions (contact targets) 13 are formed by performing Au plating on the openings 6. In the case of a manufacturing process of a flash memory or the like, at step S17 a test (retention baking) for detecting erasure of written data called a retention failure and a probe test are performed. If no abnormality is found in the tests of step S17, solder bumps 15 are formed in the first metal pad regions (openings 5) at step S18. The diameter and the height of the solder bumps 15 are set at 180 μm and 100 μm, respectively, and the ratio of the latter to the former is set at less than 60%. At step S19, semiconductor integrated circuit chips are cut out by dicing. At step S20, a burn-in test is performed. After the burn-in test, at step S21, tests are performed to check whether or not the semiconductor integrated circuit chips operate normally. At step S22, the semiconductor integrated circuit chips are subjected to an appearance test and are made final products. The test process (step S21) and the appearance inspection process (S22) are together called a selection process for selecting non-defective products.

Next, the burn-in test (step S20) will be described in detail.

Figure 2:
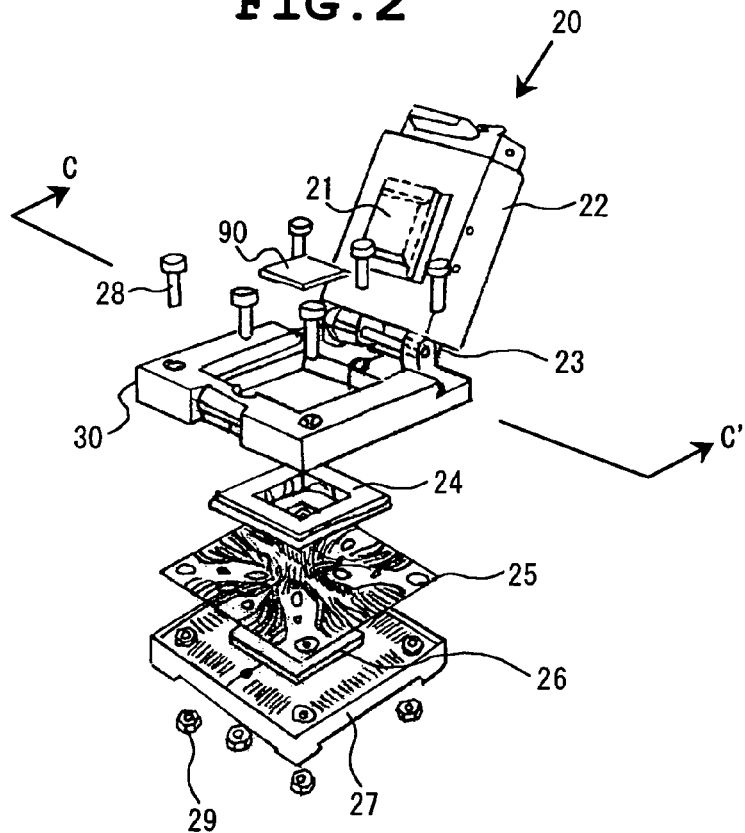
FIG. 2 is an exploded perspective view of a socket which is used in the manufacturing method of a semiconductor integrated circuit device.

FIG. 2 shows a socket to which a semiconductor integrated circuit chip is attached in a burn-in test.

A cover 22 is supported by a frame 30 having an opening via a hinge mechanism 23 so as to be openable and closable. A pusher 21 for pressing a semiconductor integration circuit chip 90 is provided at the center of the cover 22. An alignment plate 24 is fitted in the opening of the frame 30. To position the semiconductor integration circuit chip 90, the alignment plate 24 has an opening which conforms in size to the semiconductor integration circuit chip 90. A tape circuit 25 is provided under the alignment plate 24, and a base 27 capable of supporting the tape circuit 25 is provided with an elastomer 26 interposed in between. The tape circuit 25 is provided with pad electrodes capable of contacting the solder bumps 15 of the semiconductor integration circuit chip 90 and interconnections which are connected to the pad electrodes. The elastomer 26 is made of silicone rubber and is attached to the base 27. Interposing the elastomer 26 between the tape circuit 25 and the base 27 stabilizes the contact between the solder bumps 15 and the above-mentioned pad electrodes. Bolt holes into which bolts 28 can be inserted are formed through the frame 30, the tape circuit 25, and the base 27. The frame 30 and the tape circuit 25 are fixed to the base 27 by six bolts 28 and corresponding six nuts 29. The base 27 is attached to a burn-in test machine and test terminals for a burn-in test are connected to the bump electrodes 15 via the base 27 and the tape circuit 25.

Figure 3A:
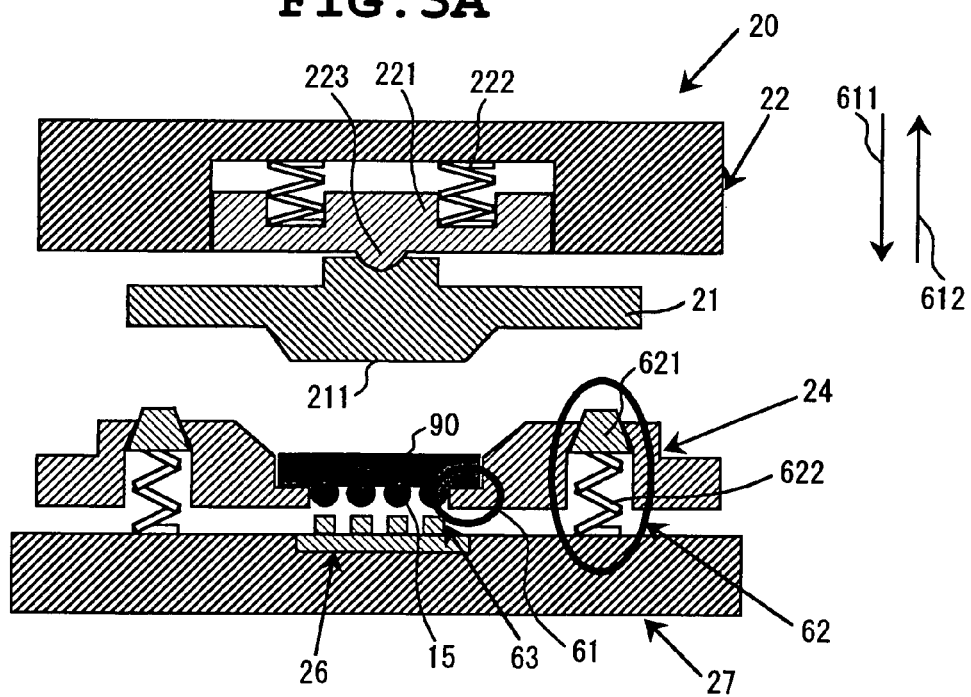
FIG. 3A is a sectional view which is taken along line C-C' in FIG. 2 and shows the socket in an assembled state.
Figure 3B:
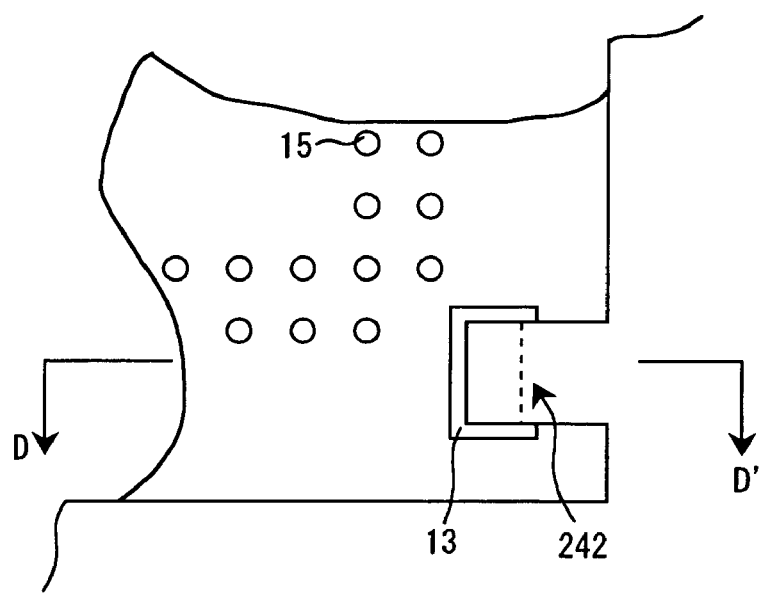
FIG. 3B is a plan view of an important part of a detachment mechanism shown in FIG. 3A.
Figure 3C:
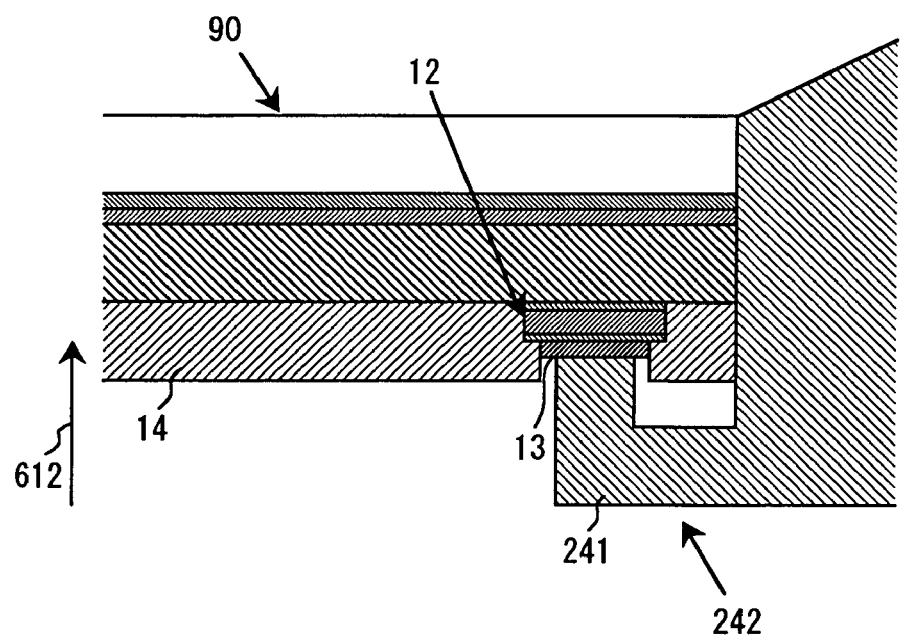
FIG. 3C is a sectional view taken along line D-D' in FIG. 3B.

FIG. 3A is a sectional view which is taken along line C-C' in FIG. 2 and shows the socket 20 in an assembled state. FIG. 3B shows an important part of a detachment mechanism 61 (as viewed from the base 27 side) shown in FIG. 3A. FIG. 3C is a sectional view taken along line D-D' in FIG. 3B.

The inside surface of the cover 22 is formed with a recess, where a pusher pressing portion 221 is inserted via springs 222. When the cover 22 is closed, the springs 222 are pressed and resulting recovery force is exerted on the pusher pressing portion 221 in the direction indicated by arrow 611. The pusher pressing portion 221 has a projection 223. Since the pusher 21 is pressed against the semiconductor integrated circuit device 90 by the projection 223, the pusher 21 is swingable. As a result, when the cover 22 is closed, a chip pressing surface 211 of the pusher 21 faces the semiconductor integrated circuit device 90 squarely, whereby uniform pressing pressure can be applied to the entire top surface of the semiconductor integrated circuit device 90.

As shown in FIGS. 3B and 3C, arms 242 capable of supporting the semiconductor integrated circuit device 90 are provided in the opening of the alignment plate 24. Tip portions of the arms 242 project toward the chip 90 to become projections 241 (pushing members). The contact targets 13 of the semiconductor integrated circuit device 90 are brought into contact with only the projections 241. The contact surfaces, to contact the respective contact targets 13, of the projections 241 have a rectangular shape (not restricted to this shape), and measure 150 µm (vertical)×400 µm (horizontal). The area of each contact target 13 may be made two times or more of the area of each opening 5 in which a solder bump 15 is formed. In this case, it is preferable that like the area of each contact target 13 the area of the surface, to contact the corresponding contact target 13, of each projection 241 be two times or more of the area of each opening 5. As the area of contact between the contact targets 13 and the projections 241 increases, the damage per unit area that the contact targets 13 receive from the projections 241 decreases.

The polyimide protective film 14 is formed in the semiconductor integrated circuit device 90. Since as described above the projections 241 are brought into contact with only the contact targets 13 and hence are not brought into contact with the protective film 14, the protective film 14 is prevented from being damaged by the projections 241.

The main portion, such as the tip portion, of each projection 241 maybe made of a polymeric resin (insulator) such as a polyether sulfon resin. In this case, the projections 241 can accommodate a case that the contact targets 13 are not in a floating state.

The alignment plate 24 is provided with alignment plate pre-pushing mechanisms 62. Each alignment plate pre-pushing mechanism 62 includes a pre-pushed portion 621 which is disposed in a tapered through-hole formed in the alignment plate 24 and a spring 62 which supports the pre-pushed portion 621. The circumferential surface of the pre-pushed portion 621 has the same inclination as the tapered portion of the through-hole of the alignment plate 24. When the pre-pushed portion 621 is fitted in the through-hole, its tip portion having a small length projects and comes into contact with the pusher 21. With this measure, when the cover 22 is closed, the pre-pushed portions 621 are pushed by the pusher 21 earlier than the alignment plate 24 is. That is, the pre-pushed portions 621 are pushed down by a small length as the springs 62 are compressed. Only after the pre-pushed portions 621 have been pushed down by the small length, the chip pressing surface 211 of the pusher 21 comes into contact with the top surface of the semiconductor integrated chip 90 and the semiconductor integrated chip 90 is weighted in the direction indicated by arrow 611. As a result, the solder bumps 15 of the semiconductor integrated chip 90 are brought into contact with projections 63 (metal projection electrodes). The projections 63 are provided on pads that are formed on the tape circuit 25 (see FIG. 2). As described later in detail, plural pads are provided so as to correspond to the plural solder bumps 15 of the semiconductor integrated chip 90. The solder bumps 15 being in contact with the projections 63 of the pads allow exchange of various signals between the semiconductor integrated chip 90 and an external circuit (tester). On the other hand, when the cover 22 is opened, the recovery force of the springs 622 pushes up the alignment plate 24 in the direction indicated by arrow 612, whereby the solder bumps 15 of the semiconductor integrated chip 90 are detached from the projections 63 of the tape circuit 25. In the sense described above, the arms 242 of the alignment plate 24 are called "detachment mechanisms 61."

Figure 4:
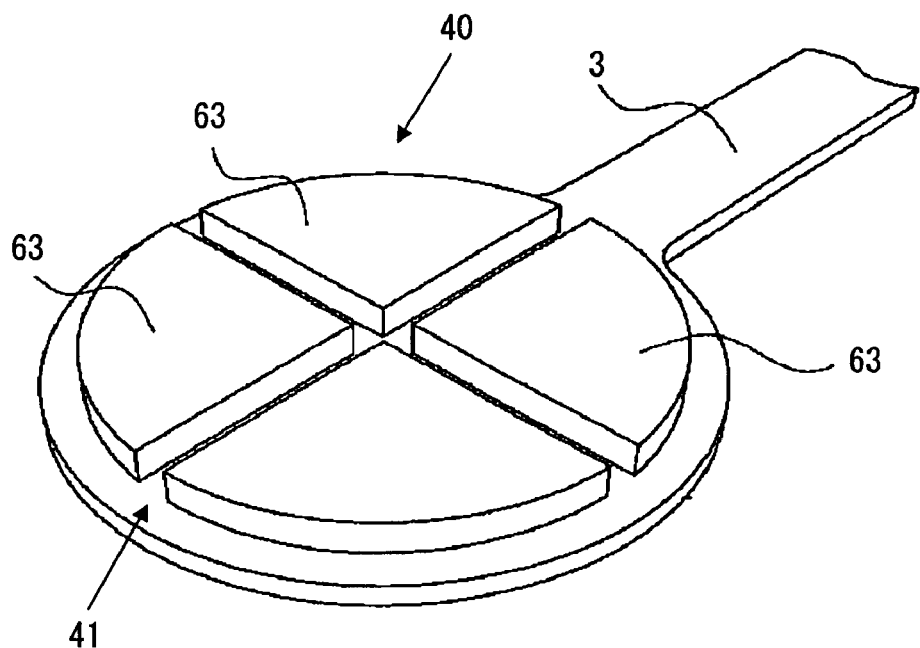
FIG. 4 is a perspective view of a pad which is provided in the socket.

FIG. 4 shows one of the plural pads formed on the tape circuit 25 (see FIG. 2).

Cruciform slits 41 are formed on the surface of each of the plural pads 40 which are formed on the major surface of the tape circuit 25, whereby four projections 63 are formed. The four projections 63 are provided to secure a stable electrical contact resistance between the solder bump 15 and the pad 40, and are metal members formed by plating the surface of a Cu layer with Ni and Au. The element Ni gives high rigidity to the projections 63 and Au has an effect of making the contact resistance low. The Au plating layer may be subjected to rhodium plating, which is expected to provide an effect of weakening the physical or chemical affinity between the projections 63 and the solder bumps 15.

Figure 5:
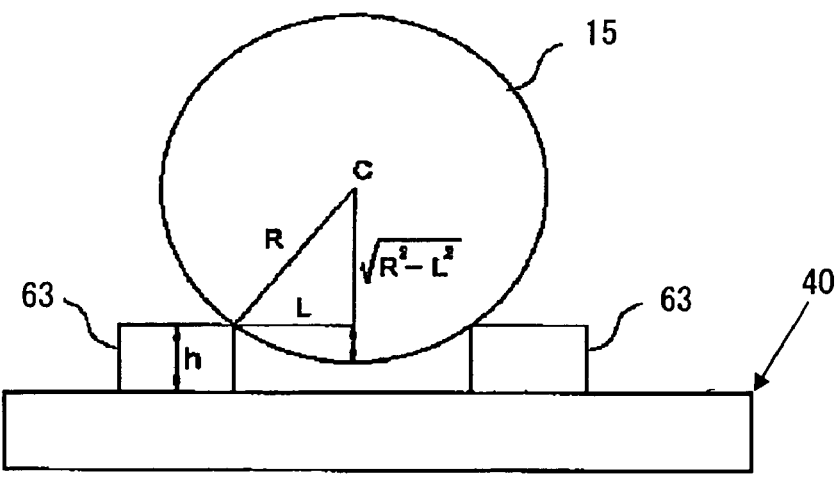
FIG. 5 illustrates a relationship between projections of a pad and a solder bump of a semiconductor integrated circuit chip.

The height of and the distance between the plural projections 63 are determined so that the bottom of a solder bump 15 which is to be connected to the projections 63 do not come into contact with the surface of the pad 40. More specifically, as shown in FIG. 5, the height h of the projections 63 and the maximum distance L between the edge of each projection 63 and the vertical line passing through the center C of a solder bump 15 to be brought into contact with the projections 63 in a plane that is parallel with the surface of the pad 40 are set so as to satisfy the following Formula 1:

$$h > R - \sqrt{R^2 - L^2} \quad (1)$$

where R is the radius of the solder bump 15.

In an actual burn-in test, the solder dumps 15 are crushed to some extend to secure sufficient contact areas between the solder bumps 15 and the projections 63 and are deformed due to heat generated during the test. Therefore, it is desirable that the height h of the projections 63 have a certain margin. Even in the case where the height h of the projections 63 and the maximum distance L satisfy the above condition, if the height h of the projections 63 is smaller than 5 µm, the bottom of a solder bump 15 may contact that portion of the surface of the pad 40 which is adjacent to a gap (slit 41) between adjoining projections 63 when the solder bump 15 is crushed or deformed due to heat generated during a test. As burn-in tests are repeated, the thickness of the solder material stuck to that portion of the surface of the pad 4 which is adjacent to the gap between the projections 63 may increase gradually to make it difficult for the projections 63 to provide their intended advantage. In view of this, the height h of the projections 63 should be greater than or equal to 5 µm, desirably greater than or equal to 10 µm.

Figure 7A:
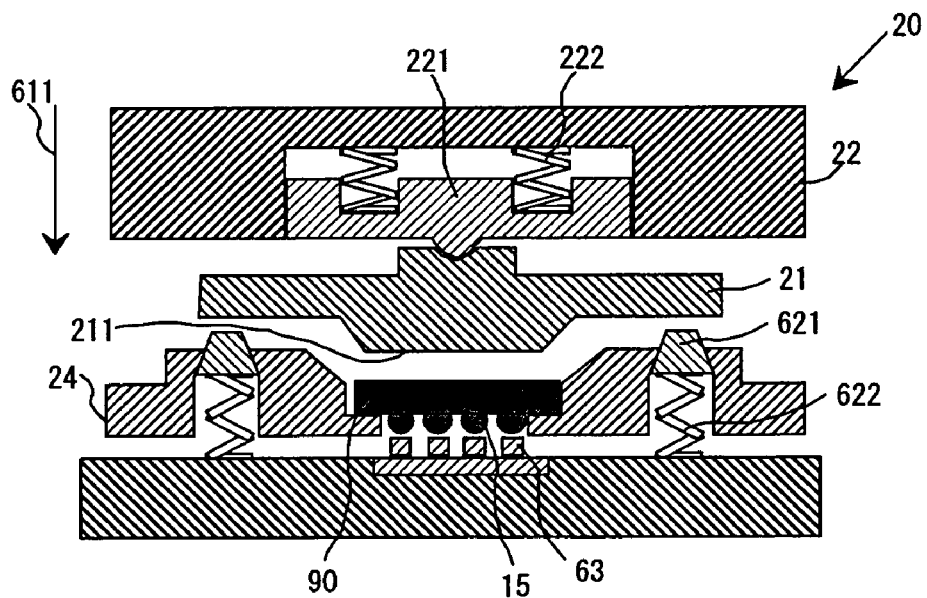
FIGS. 7A-7C illustrate how members work when a cover of the socket is closed.

FIG. 7A shows how the semiconductor integrated circuit chip 90 is attached to the socket 20.

Figure 6:
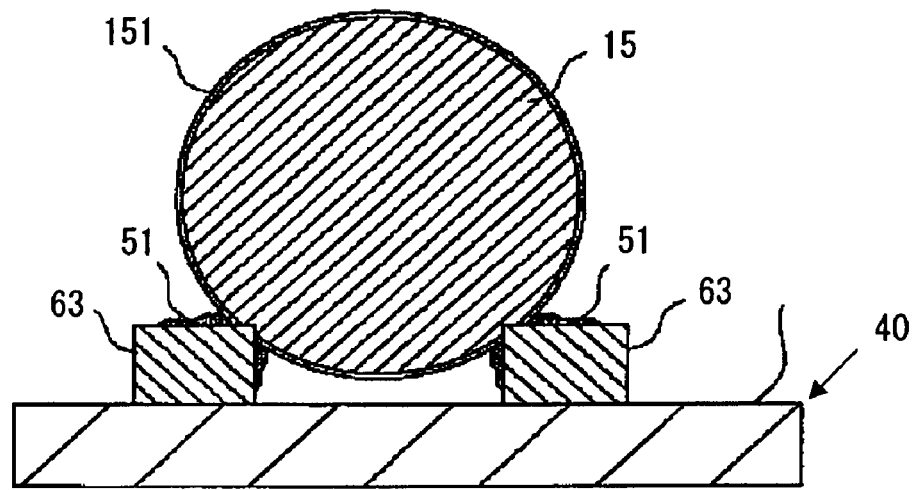
FIG. 6 illustrates another relationship between projections of a pad and a solder bump of a semiconductor integrated circuit chip.
Figure 7B:
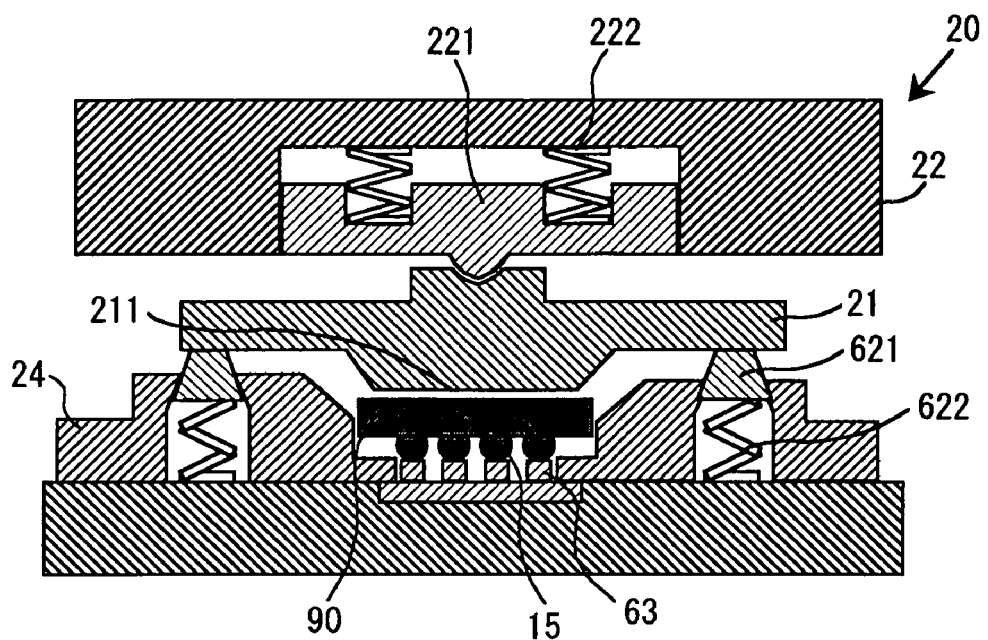
Figure 7C:
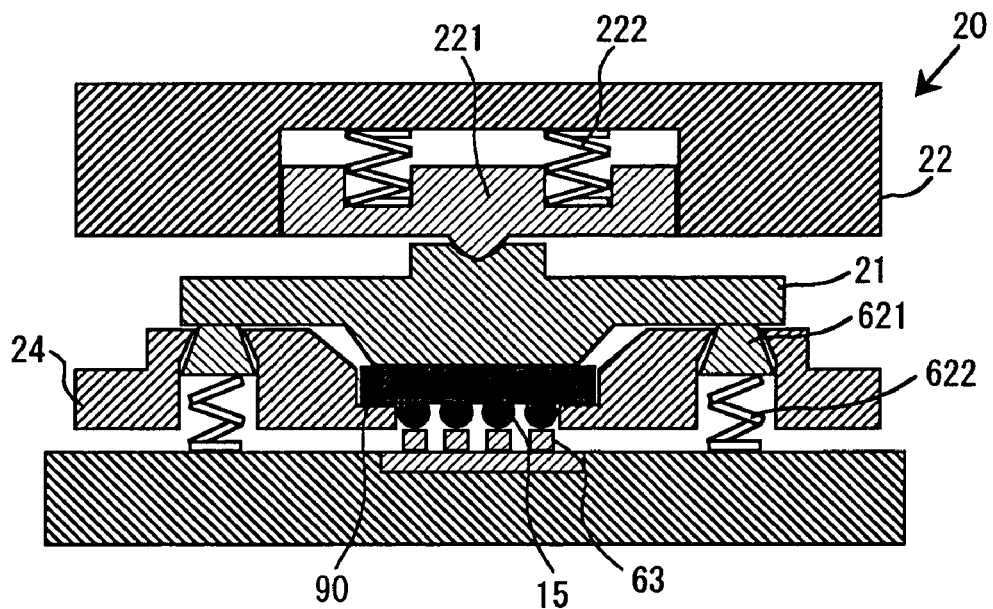

If the cover 22 is closed in a state that a semiconductor integrated circuit chip 90 is placed on the alignment plate 24 of the socket 20 as shown in FIG. 7A, as shown in FIG. 7B the pre-pushed portions 621 are pushed by the pusher 21 earlier than the alignment plate 24 is, that is, the pre-pushed portions 621 are pushed down by a small length in the direction indicated by arrow 611 as the springs 62 are compressed. Only after the pre-pushed portions 621 have been pushed down by the small length, as shown in FIG. 7C the chip pressing surface 211 of the pusher 21 comes into contact with the top surface of the semiconductor integrated chip 90 and the semiconductor integrated chip 90 is weighted in the direction indicated by arrow 611. As a result, the solder bumps 15 of the semiconductor integrated chip 90 are brought into contact with the projections 63. In this state, whether the semiconductor integrated chip 90 is defective or not is judged by causing the semiconductor integrated chip 90 to operate continuously for about several hours in a high-temperature atmosphere (100° C. or higher) while supplying currents and voltages to it from an external power source. In this operation, since the height of the projections 63 and the maximum distance L are determined so as to satisfy Formula 1, as shown in FIG. 6 the edges of the projections 63 of the pad 40 are brought into contact with the solder bump 15 and cut into the solder bump 15 by breaking a thin natural oxide film 151 formed on its surface. After burn-in tests have been performed several times, high-resistivity solder residues 51 containing fragments of the natural oxide film 151 of the solder bump 15 are stuck to the surfaces of the projections 63. However, since the edges of the projections 63 cut into the solder bump 15, the solder residues 51 on the edge surfaces are pushed aside by the solder bump 15, whereby sufficient contact areas are secured between the projections 63 and the solder bump 15. Therefore, the contact resistance between the projections 63 and the solder bump 15 do not increase or vary being influenced by the natural oxide film 151 formed on the surface of the solder bump 15 or the solder residues 51 on the surfaces of the projections 63. This advantage becomes more remarkable as the height h of the projections 63 increases.

Figure 8:
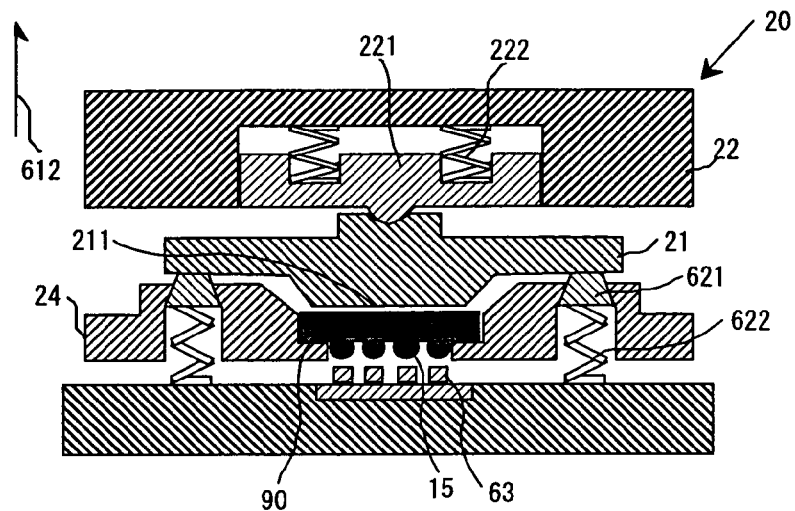
FIG. 8 illustrate how the members work when the cover of the socket is opened.

When the cover 22 is opened to replace the semiconductor integrated circuit chip 90 with another chip, as shown in FIG. 8, the recovery force of the springs 622 causes the tip portions of the pre-pushed portions 621 to push up the alignment plate 24 in the direction indicated by arrow 612. Therefore, even in the case where (part of) the projections 63 and (part of) the bump electrodes 15 are joined to each other because the edges of the projections 63 have cut into the solder bumps 15 or the topmost Au plating layers of the projections 63 have a physical or chemical affinity for the solder material of the bump electrodes 15, the solder bumps 15 of the semiconductor integrated circuit chip 90 can easily be detached from the projections 63 of the pads 40. In this detachment process, as shown in FIGS. 3B, 3C, and 9, the tip projections 241 of the arms 242 of the alignment plate 24 are in contact with the contact targets 13 of the semiconductor integrated circuit chip 90 and nothing is in contact with the protective film 14 of the semiconductor integrated circuit chip 90. The protective film 14 is thus prevented from being damaged. The semiconductor integrated circuit chip 90 is replaced by another chip, which will be subjected to the same burn-in test as described above.

Semiconductor integrated circuit chips 90 that have been selected as being non-defective by the selection process (steps S21 and S22) are supplied to a user. When the user manufacture an electronic apparatus by mounting a selected semiconductor integrated circuit chip 90 on a component mounting board of the electronic apparatus, the contact targets 13 of the semiconductor integrated circuit chip 90 can be used for positioning. More specifically, since as shown in FIG. 9 the contact targets 13 are formed at the four corners of the semiconductor integrated circuit chip 90, the semiconductor integrated circuit chip 90 can easily be positioned in mounting it on the component mounting board of the user by forming, on the component mounting board of the user, positioning marks which can come into contact with the respective contact targets 13 and bringing the contact targets 13 of the semiconductor integrated circuit chip 90 into contact with the positioning marks. For example, projections which can be fitted into the respective contact targets 13 may be provided on the component mounting board as the positing marks.

The above embodiment provides the following workings and advantages:

(1) By virtue of the detachment mechanisms 61, when the cover 22 is opened, the recovery force of the springs 622 pushes up the alignment plate 24 in the direction indicated by arrow 612 as shown in FIG. 8. Therefore, even in the case where (part of) the projections 63 and (part of) the bump electrodes 15 are joined to each other because the edges of the projections 63 have cut into the solder bumps 15 or the topmost Au plating layers of the projections 63 have a physical or chemical affinity for the solder material of the bum electrodes 15, the recovery force of the springs 622 pushes up the alignment plate 24 in the direction indicated by arrow 612 and hence the solder bumps 15 of the semiconductor integrated circuit chip 90 can easily be detached from the projections 63 of the pads 40.

(2) Since the solder bumps 15 of the semiconductor integrated circuit chip 90 can easily be detached from the projections 63 of the pads 40 by virtue of the workings and advantage of item (1), automatic insertion and removal of the semiconductor integrated circuit chip 90 in a burn-in test is facilitated.

(3) The contact targets 13 are formed on the semiconductor integrated circuit chip 90. The tip projections 241 of the arms 242 of the alignment plate 24 are in contact with the contact targets 13 and nothing is in contact with the protective film 14 of the semiconductor integrated circuit chip 90. The protective film 14 is thus prevented from being damaged.

The invention made by the present inventors has been described above in a specific manner. However, it goes without saying that various modifications are possible without departing from the spirit and scope of the invention.

For example, elastic members of another kind may be used in place of the springs 622 or the alignment plate 24 may be pushed up by introducing air into the socket 20.

Although in the above embodiment the arrangement pitch of the solder bumps 15 is set smaller than 0.5 mm, the invention is not limited to such a case. However, the problem that it is difficult to detach the solder bumps 15 from the pads 40 of the socket 20 due to insufficient suction force of a vacuum pad arises when the arrangement pitch of the solder bumps 15 is smaller than 0.5 mm. Therefore, the advantage of the invention is remarkable when the arrangement pitch of the solder bumps 15 is smaller than 0.5 mm.

Although in the above embodiment the number of contact targets 13 is four per semiconductor integrated circuit chip, satisfactory results can be obtained as long as two or more contact targets 13 are provided. Where the number of contact targets 13 is three or more per semiconductor integrated circuit chip, inclination of the semiconductor integrated circuit 90 can be prevented in the process (detachment process) of detaching the solder bumps 15 of the semiconductor integrated circuit 90 from the projections 63 of the pads 40. Therefore, the plural contact targets 13 are pressed uniformly and hence forces are applied to the plural solder bumps 15 relatively uniformly.

Although in the above embodiment the bump electrodes are made of solder, they may be made of a metal other than solder. The term "bump electrode" means a projected electrode, and each land corresponds to a bump electrode in a land grid array package or the like.

The invention disclosed in this application can be applied to the manufacture of a semiconductor integrated circuit device of not only the wafer-level CPS but also any of other package forms such as the BGA. Furthermore, the invention disclosed in this application can be applied to the manufacture of an electronic circuit or an electronic circuit device in which semiconductor devices are mounted on a package board as typified by a multi-chip module. For example, the invention can be applied to a manufacturing process which includes a first process of mounting plural semiconductor integrated circuit chips as circuit devices on package boards of multi-chip modules, a second process of testing the multi-chip modules each incorporating the plural semiconductor integrated circuit chips, and a third process of selecting non-defective modules from the tested multi-chip modules. The third process includes a first sub-process of attaching, to a mounting socket of a tester, each multi-chip module in which the semiconductor integrated circuit chips are mounted on the package board, a second sub-process of causing the multi-chip module to operate together with the mounting socket while pressing external connection electrodes of the package board against pad electrodes of the mounting socket by pressing the attached multi-chip module, and a third sub-process of canceling the pressing pressure acting on the multi-chip module and pushing up the multi-chip module in such a direction as to detach the external connection electrodes from the pad electrodes after the end of operation of the multi-chip module. The same detachment mechanisms described above with reference to FIGS. 2 and 3A may be employed in the mounting socket. This makes it possible to detach the multi-chip module easily and reliably. The electronic circuit device is not limited to a multi-chip module.

The polymeric resin film used for formation of a wafer may be one containing a thermosetting resin or a heat-resistant thermosetting resin as a main component. The latter polymeric resin film includes a polyimide resin and a BCB (benzocyclobutene) resin. Polyimide resins include ones that are low in heat resistance, which can even be used as long as they can endure a burn-in test.

The invention is suitable for manufacture of semiconductor integrated circuit devices.

What is claimed is:

1. A manufacturing method of a semiconductor integrated circuit device, comprising the steps of:
    (a) forming ordinary interconnections on a first major surface of a wafer;
    (b) forming re-interconnections including plural first metal film regions and plural second metal film regions over the ordinary interconnections;
    (c) forming a polymeric resin film over the re-interconnections;
    (d) forming plural first metal pad regions and plural second metal pad regions by forming openings through portions of the polymeric resin film which correspond to the first metal film regions and the second metal film regions, respectively, by a lithography technique;
    (e) forming bumps on the respective first metal pad regions;
    (f) after the step (e), dividing the wafer into plural semiconductor integrated circuit chips;
    (g) causing a bump formation surface, corresponding to the first major surface of the wafer, of a first semiconductor integrated circuit chip among the plural divisional semiconductor integrated circuit chips to be opposed to an electrode surface of a burn-in test socket, and performing a burn-in test in a state that the plural bumps on the bump formation surface and plural metal projection electrodes on the electrode surface are pressed against each other; and
    (h) after the step (g), separating the metal projection electrodes and the bumps of the first semiconductor integrated circuit chip from each other by pushing at least one of the plural second metal pad regions on the bump formation surface in such a direction that the first semiconductor integrated circuit chip and the electrode surface go away from each other by bringing at least one pushing member whose contact surface is narrower than the at least one second metal pad region into contact with the at least one second metal pad region.

2. The manufacturing method of a semiconductor integrated circuit device according to claim 1, wherein the polymeric resin film contains a thermosetting resin as a main component.

3. The manufacturing method of a semiconductor integrated circuit device according to claim 1, wherein the polymeric resin film contains a heat-resistant thermosetting resin as a main component.

4. The manufacturing method of a semiconductor integrated circuit device according to claim 1, wherein the polymeric resin film contains a polyimide resin as a main component.

5. The manufacturing method of a semiconductor integrated circuit device according to claim 1, wherein the polymeric resin film contains an organic thermosetting resin as a main component.

6. The manufacturing method of a semiconductor integrated circuit device according to claim 1, wherein a pitch of the bumps is smaller than 500 μm.

7. The manufacturing method of a semiconductor integrated circuit device according to claim 1, wherein the bumps are formed by a lithography technique or a printing technique.

8. The manufacturing method of a semiconductor integrated circuit device according to claim 1, wherein a ratio of a height to a diameter of the bumps in terms of an average ratio of completed bumps in the chip is smaller than 60%.

9. The manufacturing method of a semiconductor integrated circuit device according to claim 1, wherein the number of at least one second metal pad region in the first semiconductor integrated circuit chip is two or more.

10. The manufacturing method of a semiconductor integrated circuit device according to claim 1, wherein the number of at least one second metal pad region in the first semiconductor integrated circuit chip is three or more.

11. The manufacturing method of a semiconductor integrated circuit device according to claim 1, wherein the at least one second metal pad region in the first semiconductor integrated circuit chip is provided in a chip peripheral portion of the bump formation surface of the first semiconductor integrated circuit chip.

12. The manufacturing method of a semiconductor integrated circuit device according to claim 1, wherein the at least one second metal pad region in the first semiconductor integrated circuit chip is provided in a chip corner portion of the bump formation surface of the first semiconductor integrated circuit chip.

13. The manufacturing method of a semiconductor integrated circuit device according to claim 1, wherein the at least one second metal pad region in the first semiconductor integrated circuit chip is in an electrically floating state.

14. The manufacturing method of a semiconductor integrated circuit device according to claim 1, wherein an area of each of the second metal pad regions is larger than that of each of the first metal pad regions.

15. The manufacturing method of a semiconductor integrated circuit device according to claim 1, wherein an area of each of the second metal pad regions is two times or more larger than that of each of the first metal pad regions.

16. The manufacturing method of a semiconductor integrated circuit device according to claim 1, wherein an area of each of the second metal pad regions is three times or more larger than that of each of the first metal pad regions.

17. The manufacturing method of a semiconductor integrated circuit device according to claim 1, wherein an area of the contact surface of each of the at least one pushing member is two times or more larger than that of each of the first metal pad regions.

18. The manufacturing method of a semiconductor integrated circuit device according to claim 1, wherein the at least one pushing member is not brought into contact with a top surface of the polymeric resin film.

19. The manufacturing method of a semiconductor integrated circuit device according to claim 1, wherein each of the metal projection electrodes is formed by forming a plating layer having gold as a main component on a core member having nickel as a main component.

20. The manufacturing method of a semiconductor integrated circuit device according to claim 19, wherein each of the metal projection electrodes is formed by further plating, with rhodium, the plating layer having gold as the main component.

21. The manufacturing method of a semiconductor integrated circuit device according to claim 18, wherein the polymeric resin film contains a polyimide resin as a main component.

22. The manufacturing method of a semiconductor integrated circuit device according to claim 18, wherein the number of at least one second metal pad region in the first semiconductor integrated circuit chip is three or more.

23. The manufacturing method of a semiconductor integrated circuit device according to claim 18, wherein the at least one second metal pad region in the first semiconductor integrated circuit chip is provided in a chip corner portion of the bump formation surface of the first semiconductor integrated circuit chip.

24. The manufacturing method of a semiconductor integrated circuit device according to claim 23, wherein the number of at least one second metal pad region in the first semiconductor integrated circuit chip is three or more.

25. The manufacturing method of a semiconductor integrated circuit device according to claim 24, wherein the at least one second metal pad region in the first semiconductor integrated circuit chip is provided in a chip corner portion of the bump formation surface of the first semiconductor integrated circuit chip.

26. The manufacturing method of a semiconductor integrated circuit device according to claim 25, wherein the polymeric resin film contains a polyimide resin as a main component.

* * * * *